(12) United States Patent
Shirasaka et al.

(10) Patent No.: US 8,040,267 B2
(45) Date of Patent: Oct. 18, 2011

(54) DECODER DEVICE AND MOVEMENT CONTROLLER

(75) Inventors: Yasuyuki Shirasaka, Osaka (JP); Norikazu Okada, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 12/712,249

(22) Filed: Feb. 25, 2010

(65) Prior Publication Data

US 2010/0225507 A1    Sep. 9, 2010

(30) Foreign Application Priority Data

Mar. 3, 2009   (JP) ................................ 2009-049257

(51) Int. Cl.
   *H03M 1/12*   (2006.01)
(52) U.S. Cl. ........................................ 341/155; 341/159
(58) Field of Classification Search ................ 341/155, 341/172, 159, 131, 132
   See application file for complete search history.

(56) References Cited

U.S. PATENT DOCUMENTS

| | | | |
|---|---|---|---|
| 4,596,978 A * | 6/1986 | Fujita ............................ | 341/159 |
| 4,912,322 A | 3/1990 | Ichikawa | |
| 5,211,999 A * | 5/1993 | Okada ........................... | 428/34.5 |
| 5,424,736 A * | 6/1995 | Stryjewski .................... | 341/161 |
| 5,438,193 A | 8/1995 | Takagi et al. | |
| 5,760,359 A | 6/1998 | Nakano et al. | |
| 5,825,319 A * | 10/1998 | Murden et al. ................. | 341/132 |
| 6,288,665 B1 * | 9/2001 | Tsukamoto et al. ........... | 341/155 |
| 6,816,101 B2 * | 11/2004 | Hietala et al. ................. | 341/155 |
| 7,176,817 B2 * | 2/2007 | Jensen .......................... | 341/131 |
| 2003/0169195 A1 * | 9/2003 | Hietala et al. ................. | 341/155 |
| 2006/0226349 A1 | 10/2006 | Okada et al. | |
| 2007/0008192 A1 | 1/2007 | Fujita | |
| 2008/0191923 A1 * | 8/2008 | Maskou et al. ............... | 341/172 |

FOREIGN PATENT DOCUMENTS

| | | |
|---|---|---|
| JP | 60-88316 A | 5/1985 |
| JP | 9-103086 A | 4/1997 |

* cited by examiner

*Primary Examiner* — Jean Jeanglaude
(74) *Attorney, Agent, or Firm* — Birch, Stewart, Kolasch & Birch, LLP

(57) ABSTRACT

A decoder device has a reference voltage generating section for outputting first and second threshold level signals, a first comparator for comparing a stair-stepped waveform input signal and the first threshold level signal to output a comparison result, a second comparator for comparing the input signal and the second threshold level signal to output a comparison result, and a logical operation section for performing a logical operation between output signals of the first and second comparators to output a signal decoded from the input signal. A threshold level represented by the first threshold level signal intersects a riser section of one stepped waveform out of two adjacent stepped waveforms in the input signal, and a threshold level represented by the second threshold level signal intersects a riser section of the other stepped waveform out of the two adjacent stepped waveforms of the stair-stepped waveform input signal.

5 Claims, 13 Drawing Sheets

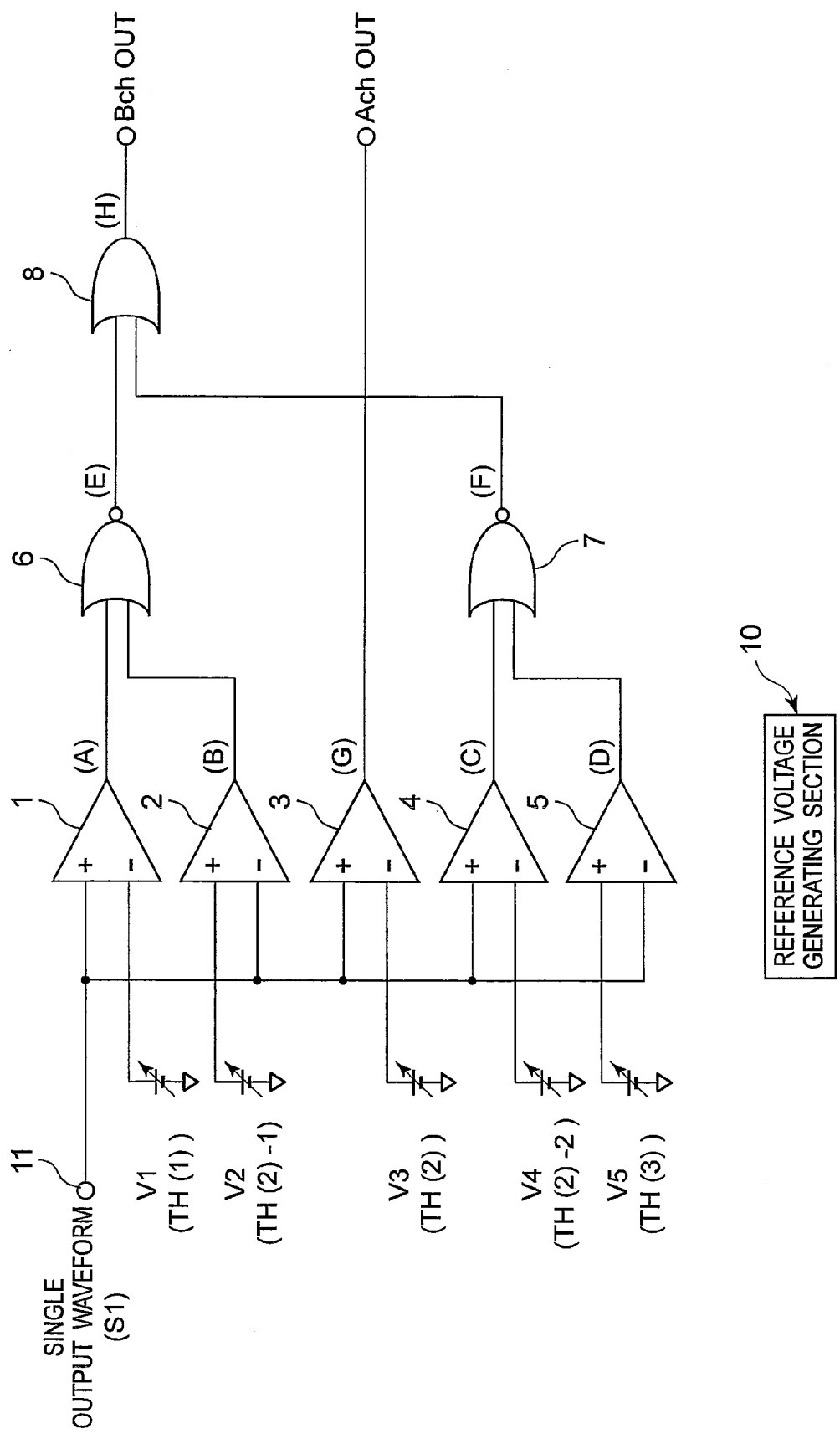

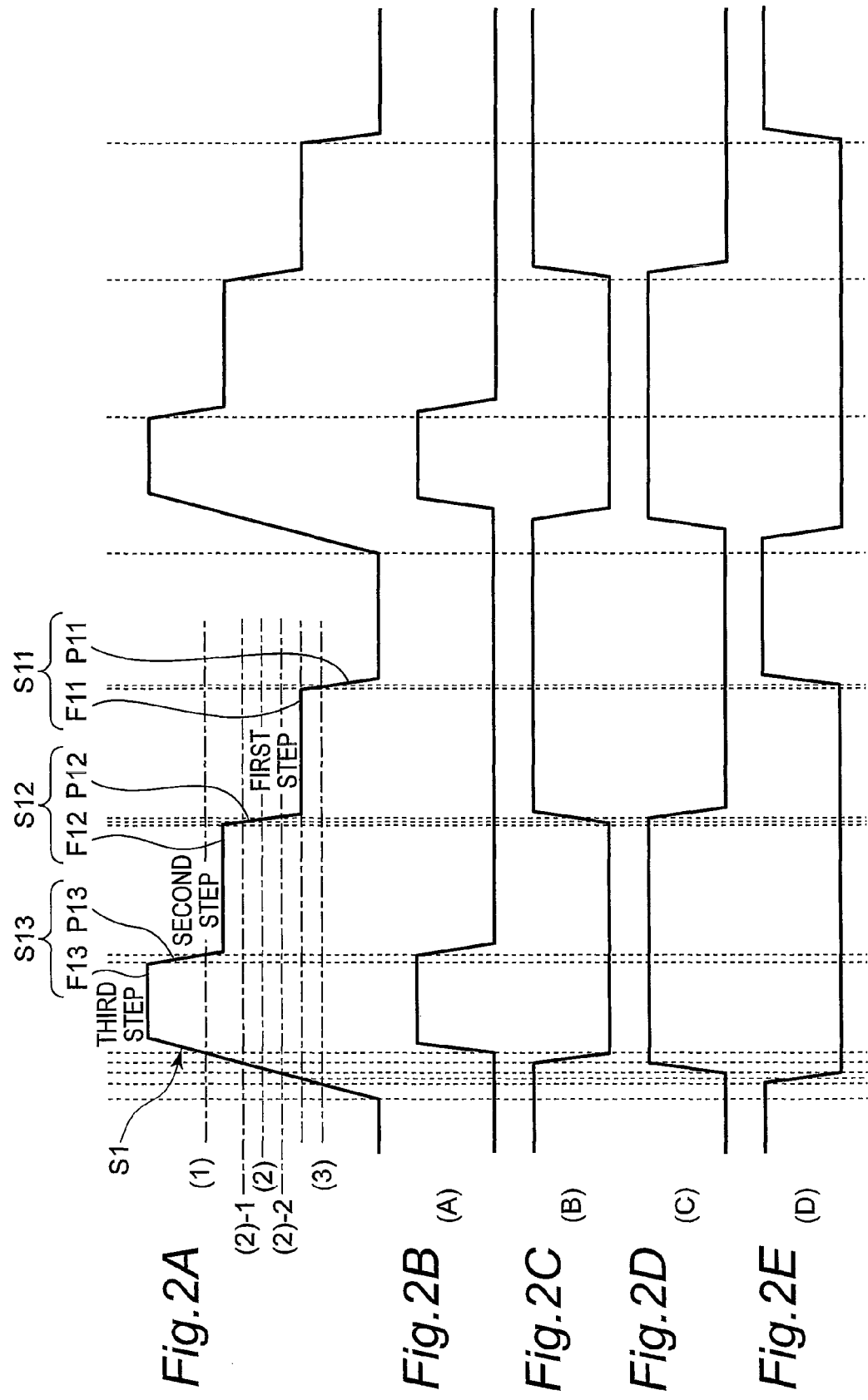

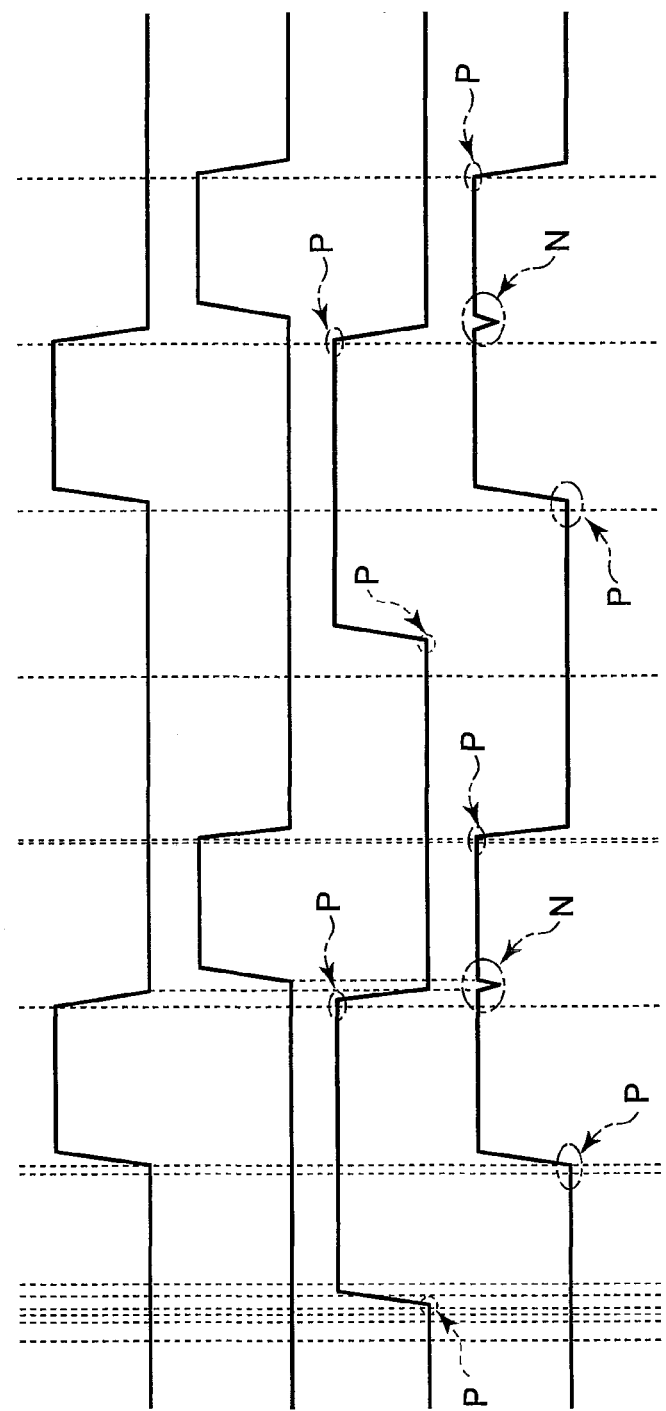

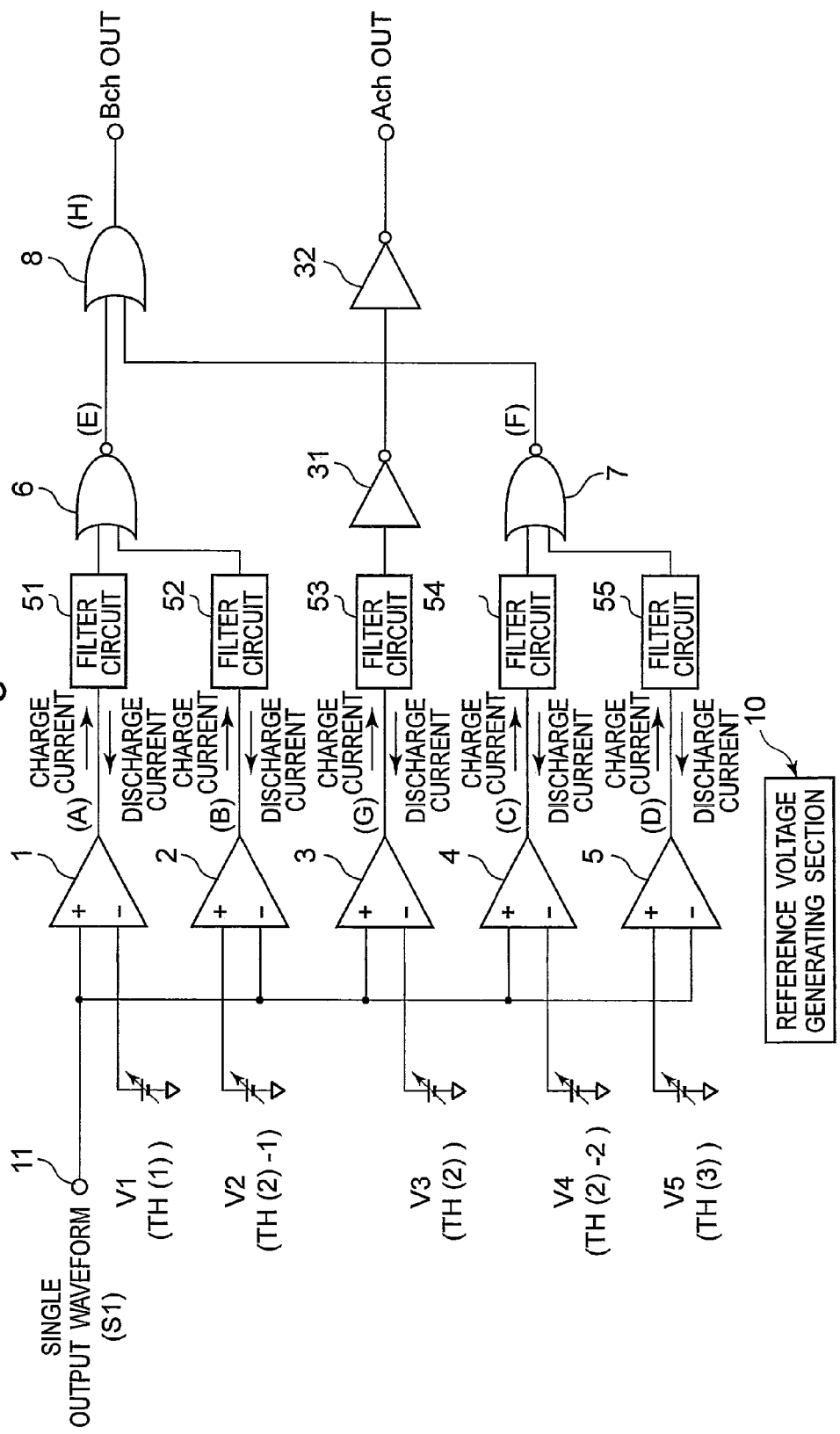

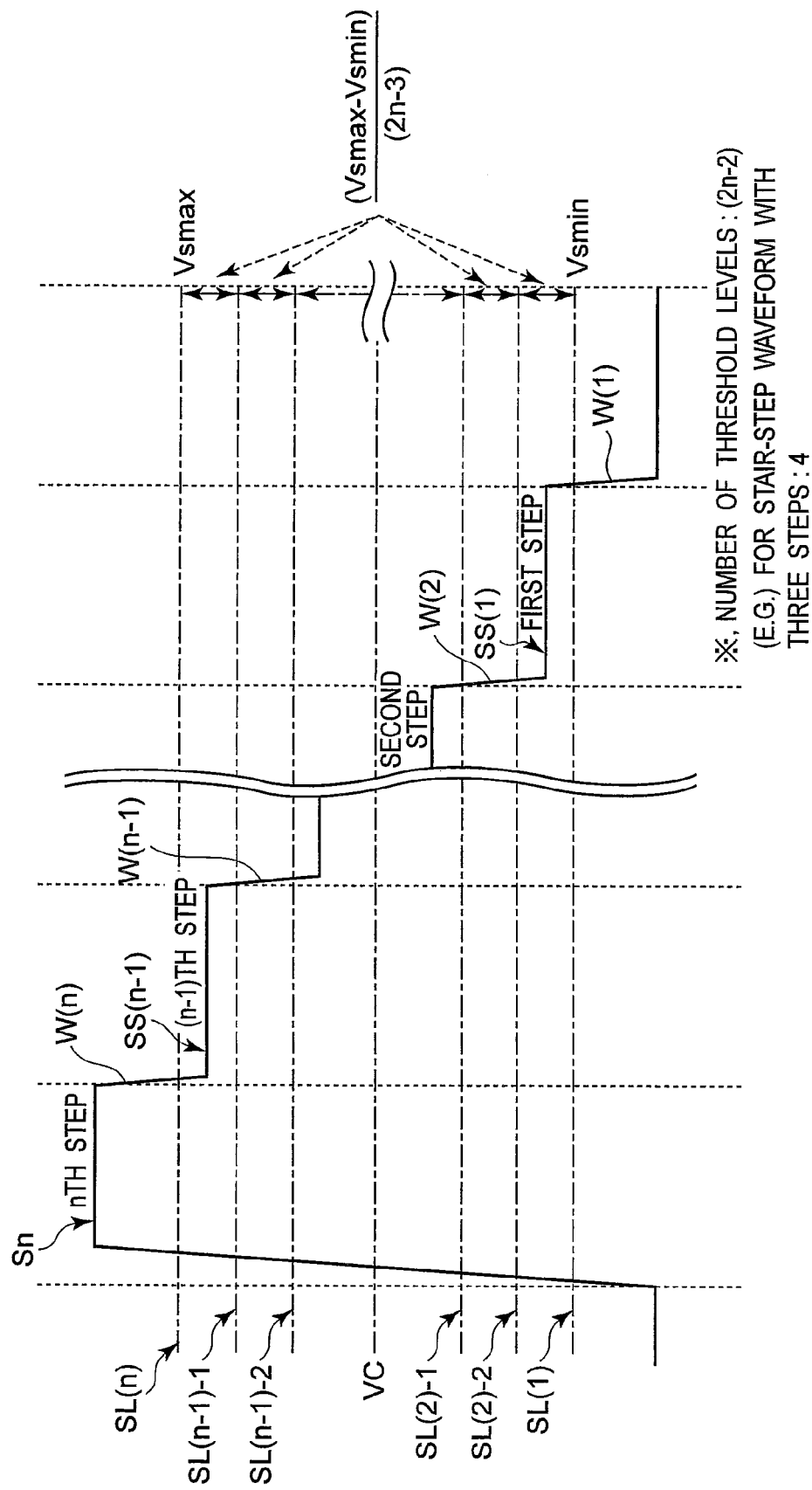

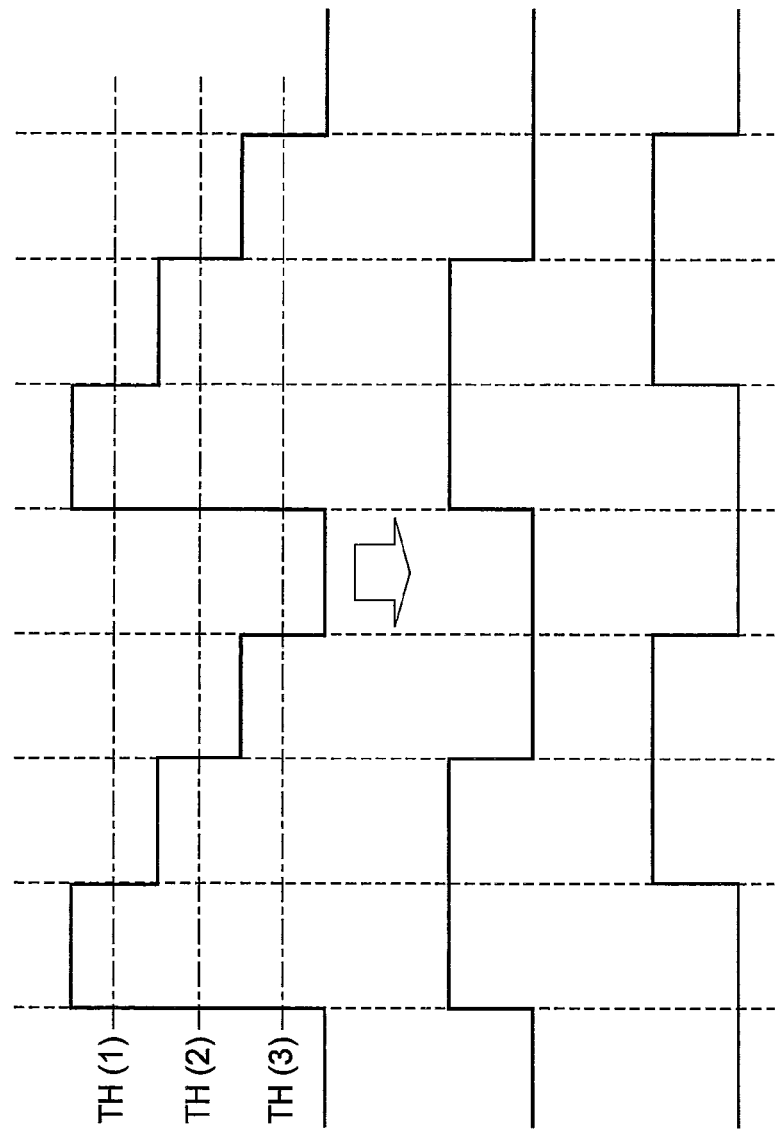

DECODER DEVICE AND MOVEMENT CONTROLLER

TECHNICAL FIELD

The present invention generally relates to a decoder device and a movement controller. The present invention relates to a decoder device for receiving an input of a coded stair-step waveform signal from an optical encoder and converting the coded stair-step waveform signal into digital signals corresponding to a plurality of output signals with different phases, the optical encoder using, for example, a light receiving element to detect a position, a moving speed, a moving direction and other data of a movable object and outputting the detection result as the coded stair-step waveform signal. The present invention also relates to a decoder device particularly suitable for use in a movement controller mounted on printing equipment such as copying machines and printers and FA (Factory Automation) equipment.

BACKGROUND ART

Conventionally, optical encoders, which use a light receiving element to detect a position, a moving speed, a moving direction and other data of a movable object, use two signals, an A-phase signal and a B-phase signal which are different in phase by 90 degrees from each other, to detect the position, the moving speed, the moving direction and other data of the movable object.

However, in response to a recent demand for downsizing and wire saving of the optical encoders, an optical encoder has been proposed which outputs those two signals as single A/B-phase pulse signal with a stair-step waveform so as to reduce the wiring number and to achieve downsizing.

It is disclosed in Patent Literature 1 (JP 560-88316 A) that two phase outputs from a rotary encoder are converted to get counter pulses corresponding to two phases, and one counter pulse is phase-inverted and is added to the other counter pulse, so that a stair-stepped waveform signal can be transmitted with a single output signal line.

It is also disclosed in Patent Literature 2 (JP H9-103086 A) that A-phase and B-phase sine wave signals obtained from a rotation detection circuit are converted into stair-step waveforms by voltage dividing and switching to enhance precision of rotational position sensing.

Microcomputers and other computers may not process the output signals with a stair-stepped waveform acquired from each of the aforementioned technology. In such a case, original digital signals such as A-phase and B-phase signals are needed after all. All the aforementioned technologies share the following problems. That is, an output signal with a stair-stepped waveform has a slew rate in a rising edge and a falling edge of the signal. As a result, when, for example, the output signal with a stair-stepped waveform is converted into two signals of digital values through comparison with a reference voltage corresponding to a specific threshold level, these two digital-value signals gain a delay, resulting in a shift in phase difference. When the output signal is converted into logical values in the same phase parts, a noise component is generated as a result of a delay, and this may cause detection error.

The causes of such phase delay and generation of the noise component will be explained hereinbelow in conjunction with a concrete example where two signals are generated from a stair step waveform, the two signals being an A-phase signal and a B-phase signal which are different in phase by 90 degrees from each other.

A stair-step waveform with three steps as shown in FIG. 10A will be discussed below. Both a single output waveform which is a stair-step waveform shown in FIG. 10A and A-phase and B-phase digital output waveforms shown in FIGS. 10B and 10C are ideal rectangular waves with an infinite slew rate. In this case, as shown in the block diagram of FIG. 9, an input signal S0 which is a single output waveform (stair-step waveform) is compared by a comparator 502 with a reference voltage V2 corresponding to a threshold level (2) (TH expresses a threshold level in FIG. 9 and other drawings.) to obtain an A-phase digital output signal Ach OUT. A signal (L) and an inversion signal (N) are inputted into a NOR circuit 505 for logical operation, the signal (L) being a signal outputted from a comparator 501 as a result of comparison between the input signal S0, which is the single stair-step waveform, and a reference voltage corresponding to a threshold level (1), the inversion signal (N) being a signal obtained by inverting, in a NOT circuit 504, a signal (M) outputted from a comparator 503 as a result of comparison between the input signal S0 and a reference voltage V3 corresponding to a threshold level (3). As a result, a B-phase digital output signal Bch OUT is obtained from the NOR circuit 505. Thus, when assuming that an input signal with a single output waveform has an infinite slew rate and an ideal waveform without delay, it becomes possible to obtain ideal A-phase output signal Ach OUT and B-phase output signal Bch OUT which are free from phase delay and which are different in phase by 90 degrees from each other.

However, as shown in FIG. 11A, an actual output waveform of the input signal S0 with a stair-step waveform needs finite lengths of time tr and tf for rising and falling due to an influence of the slew rate. In this case, as shown in FIGS. 11E and 11F, if signal processing is performed with the threshold levels (1) to (3) being respectively set for the steps of the stair-step waveform as shown above, a relative phase shift between the A-phase output signal Ach OUT and the B-phase output signal Bch OUT, a phase shift P within each of the A-phase and B-phase output signals, and a noise pulse N are generated. The phase shift as well as generation of the noise pulse in each of these output signals cause detection error. FIG. 11B shows a waveform of the output signal (L) from the comparator 501, FIG. 11C shows a waveform of the output signal (M) from the comparator 503, and FIG. 11D shows a waveform of the output signal (N) from the NOT circuit 504.

In view of the above discussion, a high-precision decoder is demanded which converts an output waveform signal (coded output signal with a stair-stepped waveform) outputted from, for example, a single output signal line of an optical encoder and the like into a plurality of digital output signals which are free from phase shift and generation of a noise pulse.

SUMMARY OF THE INVENTION

Technical Problem

Accordingly, an object of the present invention is to provide a high-precision decoder device which is capable of converting an output waveform signal (coded output signal with a stair-stepped waveform) outputted from a single output signal line of an optical encoder and the like into a plurality of digital output signals with a phase shift and a noise pulse suppressed, and a movement controller having such a decoder.

Solution to Problem

In order to solve the problem, a decoder device according to an aspect of the present invention includes:

a reference voltage generating section for outputting a first threshold level signal and a second threshold level signal;

a first comparator for receiving inputs of a stair-stepped waveform input signal and the first threshold level signal and comparing the input signal and the first threshold level signal to output a comparison result as a first comparison output signal;

a second comparator for receiving inputs of the stair-stepped waveform input signal and the second threshold level signal and comparing the input signal and the second threshold level signal to output a comparison result as a second comparison output signal; and a logical operation section for receiving inputs of the first comparison output signal and the second comparison output signal and performing a logical operation between the first comparison output signal and the second comparison output signal to output a signal decoded from the stair-stepped waveform input signal, wherein a threshold level represented by the first threshold level signal intersects a riser section of one stepped waveform out of two adjacent stepped waveforms in the stair-stepped waveform input signal, and a threshold level represented by the second threshold level signal intersects a riser section of the other stepped waveform out of the two adjacent stepped waveforms in the stair-stepped waveform input signal.

According to the decoder device of the invention, stepped waveforms with which the threshold levels by the first and second threshold level signals intersect are adjacent. Accordingly, compared to the case where another stepped waveform is present between two stepped waveforms with which the threshold levels of the first and second threshold level signals intersect, it becomes possible to reduce the phase shift at an intersection between each threshold level and a riser section of each stepped waveform caused by a slew rate of the riser section of each stepped waveform. This makes it possible to suppress the phase shift of the first and second comparison output signals due to the slew rate. Therefore, it becomes possible to provide a signal outputted by the logical operation section as a desired digital signal output with the phase shift and the noise pulse suppressed.

More specifically, in order to reduce the phase shift attributed to the slew rate, each threshold level should advantageously be set as close to each other as possible. Therefore, when each comparison output signal, which is obtained by comparing an input signal with each threshold level in each comparator, is subjected to logical operation, an influence of the slew rate on the output signal can be reduced by conducting the logical operation of the signals (first, second comparison output signals) outputted as a result of comparison with adjacent threshold levels.

It is preferable to provide a lowpass filter circuit in the logical operation section to remove a noise pulse of signals. Moreover, if the lowpass filter circuit is placed in a spot where the same processing is performed on a plurality of signals, an influence of the phase shift between signals can be reduced further. It is beneficial to provide the lowpass filter circuit with, for example, cut-off frequency fc=1 MHz since a motor control system for general use is used at 100 kHz or lower.

In one embodiment, level difference between the threshold level represented by the first threshold level signal and a boundary level which defines a boundary between the two adjacent stepped waveforms is smaller than a level difference between a center level of the riser section of the one stepped waveform and the boundary level, and a level difference between the threshold level represented by the second threshold level signal and the boundary level is smaller than a level difference between a center level of the riser section of the other stepped waveform and the boundary level.

According to the decoder device in this embodiment, the threshold level represented by the first threshold level signal and the threshold level represented by the second threshold level-signal are closer to each other than the center level of a riser section of each stepped waveform in the range where they intersect the riser section of the stepped waveform corresponding to their threshold levels. This makes it possible to reduce the phase shift at an intersection between each threshold level and a riser section of each stepped waveform caused by the slew rate of the riser section of each stepped waveform, and therefore the phase shift of the first and second comparison output signals attributed to the slew rate can be suppressed. Therefore, it becomes possible to provide a signal outputted by the logical operation section as a desired digital signal output with the phase shift and the noise pulse suppressed.

In one embodiment, the logical operation section is set as a first logical operation section, and the decoded signal outputted from the first logical operation section is set as a first decoded signal, and the reference voltage generating section outputs the first and second threshold level signals and a third threshold level signal. Also, the decoder device further includes a third comparator for receiving inputs of the stair-stepped waveform input signal and the third threshold level signal and comparing the input signal and the third threshold level signal to output a comparison result as a third comparison output signal, and a second logical operation section for receiving inputs of the third comparison output signal and performing logical operation on the third comparison output signal to output a second decoded signal decoded from the stair-stepped waveform input signal, the second decoded signal being different in phase from the first decoded signal, wherein a number of logical operations performed on the third comparison output signal by the second logical operation section to output the second decoded signal is equal to a number of logical operations performed on the first and second comparison output signals by the first logical operation section to output the first decoded signal.

According to the decoder device of this embodiment, the first decoded signal and the second decoded signal are generated through generally the same number of operations, so that the phase shift between both the decoded signals can be reduced compared to the case where the number of operations is different.

In one embodiment, the reference voltage generating section generates the threshold level signals by dividing a voltage by resistances connected in series between a reference voltage and a ground, and the reference voltage is fed as supply voltage to each of the comparators.

According to the decoder device in this embodiment, one threshold level signal generating section can generate a plurality of threshold level signals with a reference voltage divided, so that compared to the case where a plurality of threshold level signal generating sections generate a plurality of threshold level signals, the circuit area can be reduced. Further, since only one threshold level signal generating section is needed, each threshold level signal behaves in the same manner in terms of process variation, noise and the like, resulting in high consistency among the respective threshold levels. Moreover, since the reference voltage is fed as supply voltage to each comparator, comparison operation by each comparator can be executed with sufficient consistency in terms of temperature characteristics, process variation and the like, which makes it possible to reduce the noise pulse and the like.

In one embodiment, the stair-stepped waveform input signal has a stair-stepped waveform with n steps, n being three or a larger natural number;

the steps of the stair-stepped waveform have an equal amplitude voltage;

one threshold level intersects a riser section of an nth stepped waveform in the stair-stepped waveform, one threshold level intersects a riser section of a first stepped waveform in the stair-stepped waveform, two threshold levels intersect each of riser sections of a second to (n−1)th stepped waveforms in the stair-stepped waveform, and the two threshold levels intersecting the riser section of each of the second to (n−1)th stepped waveforms are symmetrically set relative to a central voltage of the respective stepped waveforms;

a voltage interval Vint(V) between respective adjacent threshold levels of (2n−2) threshold levels for the stair-stepped waveform input signal is set at a value which is calculated with a following formula (1):

$$V\text{int} = (V\text{smax} - V\text{smin})/(2n-3) \quad (1)$$

where Vsmax (V) represents a voltage of the threshold level intersecting the riser section of the nth stepped waveform in the stair-stepped waveform, and Vsmin (V) represents a voltage of the threshold level intersecting the riser section of the first stepped waveform in the stair-stepped waveform; and of said threshold levels, one threshold level which intersects the riser section of a certain stepped waveform is set as the threshold level represented by the first threshold level signal, and another threshold level which intersects the riser section of another stepped waveform different from the certain stepped waveform is set as the threshold level represented by the second threshold level-signal.

According to the decoder device of this embodiment, in the upper-end and lower-end steps of the stair-stepped waveform input signal, only one threshold level is present, whereas in each step except the upper-end and lower-end steps, two threshold levels are present. Therefore, the total number of the threshold levels is $2+(n-2)\times 2=(2n-2)$, and so the number of threshold level intervals by the (2n−2) threshold levels is set to (2n−3). A difference (Vsmax−Vsmin) between a voltage Vsmax corresponding to the maximum threshold level and a voltage Vsmin corresponding to the minimum threshold level is divided by the number of threshold level intervals (2n−3) so that the intervals of the (2n−2) threshold levels can be set with an uniform voltage difference.

Consequently, since the phase shift attributed to the slew rate of each stepped waveform of the stair-stepped waveform input signal is equally distributed among the points where each stepped waveform and each threshold level intersect with each other, the noise pulse and the phase shift attributed to the slew rate can be absorbed to the minimum level.

A movement controller according to another aspect of the present invention includes the above-described decoder device, wherein the stair-stepped waveform input signal is a signal obtained by coding a signal representing movement information of a movable object, and the logical operation section outputs a signal representing movement information decoded from the coded input signal, and wherein movement of the movable object is controlled based on the signal representing the movement information.

According to the movement controller, the signal representing the movement information decoded from the stair-stepped waveform input signal can be made into a desired digital signal with a shift delay and noise components suppressed, and therefore high-precision movement control can be implemented.

BRIEF DESCRIPTION OF DRAWINGS

The present invention will become more fully understood from the detailed description given hereinbelow and the accompanying drawings which are given by way of illustration only, and thus are not intended to limit the present invention, and wherein:

FIG. 1 is a block diagram showing a first embodiment of the decoder device of the invention;

FIG. 2A is a waveform chart of an input signal S1 in the first embodiment;

FIGS. 2B-2I are waveform charts respectively showing signal waveforms of digital signals (A), (B), (C), (D), (E), (F), (G) and (H) in the first embodiment;

FIG. 4B is a block diagram showing a fourth embodiment of the decoder device of the invention;

FIG. 5 is a diagram schematically showing an example of (2n−2) threshold levels allotted to an input signal with a stair-stepped waveform of n steps at equal intervals;

FIGS. 10A-10C are waveform charts showing a single output waveform as an ideal rectangular wave with an infinite slew rate and A-phase and B-phase digital output waveforms, respectively.

DESCRIPTION OF EMBODIMENTS

Figure 3:
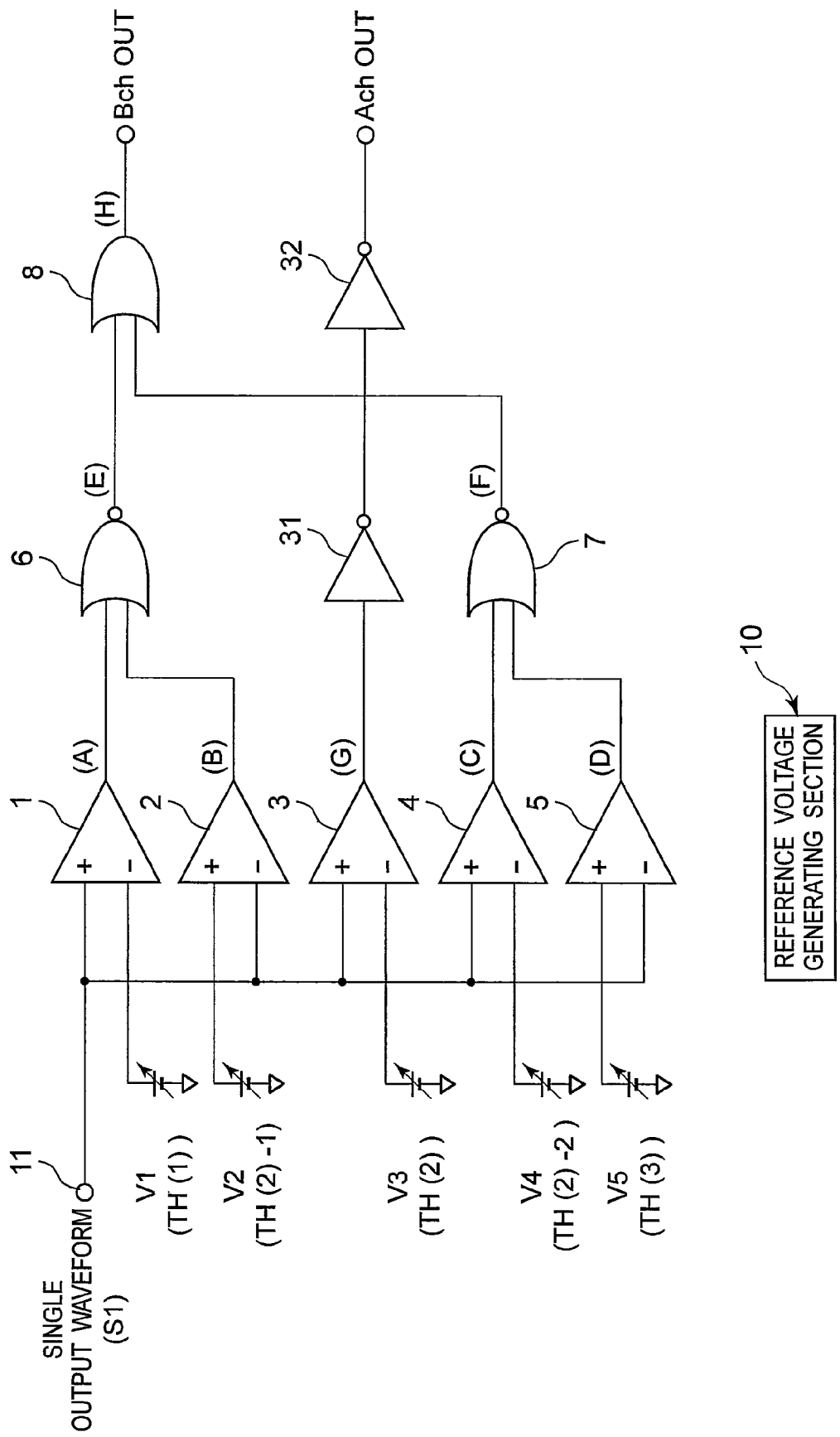
FIG. 3 is a block diagram showing a second embodiment of the decoder device of the invention.

Hereinbelow, the invention will be described in detail in conjunction with the embodiments with reference to the drawings.

First Embodiment

The block diagram of FIG. 1 shows a first embodiment of a decoder device of the invention. The decoder in the first embodiment includes comparators 1 to 5.

A non-inverting input terminal of the comparator 1 receives an input of a coded output signal with a stair-stepped waveform, as an input signal S1, which has been outputted from a single output signal line of an optical encoder and inputted into an input terminal 11. An inverting input terminal of the comparator 1 receives an input of a reference voltage V1 as a threshold level (1). A non-inverting input terminal of the comparator 2 receives an input of a reference voltage V2 as a threshold level (2)-1, and an inverting input terminal thereof receives an input of the stair-stepped waveform input signal S1 from the single output signal line. In this case, the reference voltage V1 constitutes a first threshold level signal, and the reference voltage V2 constitutes a second threshold level-signal. The comparator 1 constitutes a first comparator and the comparator 2 constitutes a second comparator.

A non-inverting input terminal of the comparator receives an input of the stair-stepped waveform input signal S1 from the single output signal line, and an inverting input terminal thereof receives an input of a reference voltage V3 as a threshold level (2). A digital output signal (G) of the comparator 3 makes an A-phase digital output signal Ach OUT.

A non-inverting input terminal of the comparator receives an input of the stair-stepped waveform input signal S1 from the single output signal line, and an inverting input terminal thereof receives an input of a reference voltage V4 as a threshold level (2)-2. A non-inverting input terminal of the comparator 5 receives an input of a reference voltage V5 as a threshold level (3), and an inverting input terminal thereof receives an input of the stair-stepped waveform input signal S1 from the single output signal line. In this case, the reference voltage V4 constitutes a first threshold level signal, and the reference voltage V5 constitutes a second threshold level-signal. The comparator 4 constitutes a first comparator and the comparator 5 constitutes a second comparator.

The decoder device of the first embodiment includes a NOR circuit 6 which receives inputs of a digital signal (A) outputted from the comparator 1 and a digital signal (B) outputted from the comparator 2 and performs a NOR operation on these signals, and a NOR circuit 7 which receives inputs of a digital signal (C) outputted from the comparator 4 and a digital signal (D) outputted from the comparator 5 and performs a NOR operation on these signals. Further, the decoder device of the first embodiment includes an OR circuit 8 which receives inputs of a digital signal (E) outputted from the NOR circuit 6 and a digital signal (F) outputted from the NOR circuit 7 and performs an OR operation on these signals. An output signal (H) of the OR circuit 8 is a B-phase output signal Bch OUT. In this case, the digital signals (A) and (C) constitute first comparison output signals, whereas the digital signals (B) and (D) constitute second comparison output signals. The NOR circuits 6, 7 and the OR circuit 8 constitute the logical operation section.

It is to be noted that the first embodiment has a reference voltage generating section 10 for outputting the reference voltages V1 to V5. The reference voltage generating section 10, which is an internal reference voltage generation circuit configured inside the decoder, generates reference voltages V1 to V5 by methods such as a method of outputting voltages obtained simply dividing a difference between a supply voltage and a GND by resistances, a common constant voltage generating method using a Zener diode and a band gap of semiconductors, etc.

As shown in FIG. 2A as an example, the coded stair-stepped waveform input signal S1 inputted into the input terminal 11 is of a stair-stepped waveform with three steps. The stair-stepped waveform with three steps is composed of a first stepped waveform S11, a second stepped waveform S12 and a third stepped waveform S13, each of the stepped waveforms S11, S12 and S13 having riser sections P11, P12, P13, and flat sections F11, F12 and F13.

It is to be noted that each of three stepped waveforms in the stair-stepped waveform has an identical step height, or height of the riser section (i.e., an amplitude voltage of each step).

In this case, the reference voltage V3 as the threshold level (2) corresponds to ½ of the total amplitude of the stair-stepped waveform input signal S1. The reference voltage V3 as the threshold level (2) serves as a central voltage between the reference voltage V2 as the threshold level (2)-1 and the reference voltage V4 as the threshold level (2)-2. The reference voltage V3 which is the threshold level (2) is also a central voltage between the reference voltage V1 which is the threshold level (1) and the reference voltage V5 which is the threshold level (3).

The threshold level (1) intersects the riser section P13 of the third stepped waveform S13 in the stair-stepped waveform with three steps and is closer to the threshold level (2)-1 than the center level of the riser section P13 of the third stepped waveform S13. The threshold level (2)-1 intersects the riser section P12 of the second stepped waveform S12 and is closer to the threshold level (1) than the center level (threshold level (2)) of the riser section P12 of the second stepped waveform S12. The threshold level (2)-2 intersects the riser section P12 of the second stepped waveform S12 and is closer to the threshold level (3) than the center level (threshold level (2)) of the riser section P12 of the second stepped waveform S12. The threshold level (3) intersects the riser section P11 of the first stepped waveform S11 and is closer to the threshold level (2)-2 than the center level of the riser section P11 of the first stepped waveform S11.

In the present embodiment, an A-phase digital output signal Ach OUT is obtained from an stair-stepped waveform input signal S1 inputted into the input terminal 11 by using one threshold level (2) inputted into one comparator 3. A B-phase digital output signal Bch OUT is obtained from the stair-stepped waveform input signal S1 by using four threshold levels (1), (2)-1, (2)-2 and (3) inputted into four comparators 1, 2, 4 and 5.

As shown in FIG. 2A, the threshold level (3) intersects the riser section P11 of the first stepped waveform S11 in the stair-stepped waveform input signal S1, while the threshold levels (2)-1 and (2)-2 intersect the riser section P12 of the second stepped waveform S12 in the input signal S1 above and below the threshold level (2). The threshold level (1) intersects the riser section P13 of the third stepped waveform S13 in the stair-stepped waveform input signal S1.

The comparator 3 compares the stair-stepped waveform input signal S1 with the reference voltage V3 of the threshold level (2) to obtain an output signal (G) of waveform shown in FIG. 2H, i.e., an A-phase digital output signal Ach OUT. The comparator 1 compares the stair-stepped waveform input signal S1 with the reference voltage V1 of the threshold level (1) to obtain a digital signal (A) of waveform shown in FIG. 2B, and the comparator 2 compares the stair-stepped waveform input signal S1 with the reference voltage V2 of the threshold level (2)-2 to obtain a digital signal (B) of waveform shown in FIG. 2C. Then, an NOR operation is performed on the digital signal (A) and the digital signal (B) in the NOR circuit 6 to obtain a digital signal (E) of waveform shown in FIG. 2F.

Meanwhile, the comparator 4 compares the stair-stepped waveform input signal S1 with the reference voltage V4 of the threshold level (2)-2 to obtain a digital signal (C) of waveform shown in FIG. 2D. The comparator 5 compares the stair-stepped waveform input signal S1 with the reference voltage V5 of the threshold level (3) to obtain a digital signal (D) of waveform shown in FIG. 2E. Then, a NOR operation is performed on the digital signal (C) and the digital signal (D) in the NOR circuit 7 to obtain a digital signal (F) of waveform shown in FIG. 2G.

Then, an OR operation is performed on the digital signal (E) and the digital signal (F) in the OR circuit 8 to obtain a digital signal (H) shown in FIG. 2I, which serves as a B-phase output signal Bch OUT.

Figure 9:
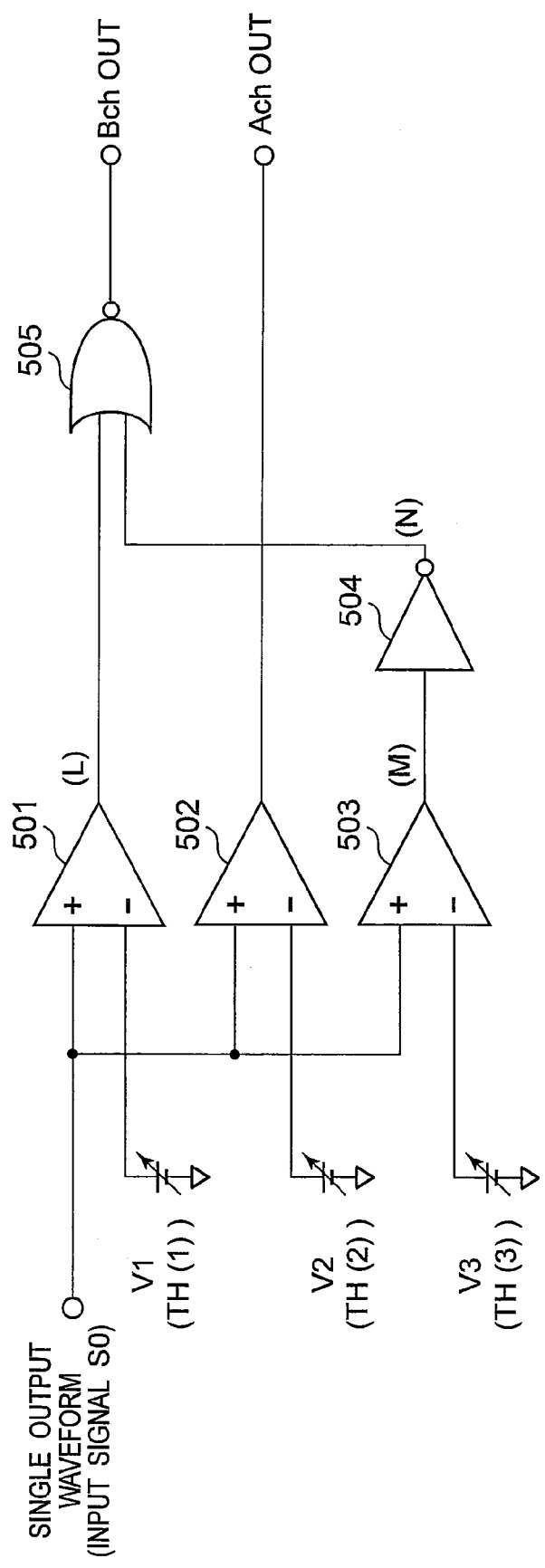
FIG. 9 is a block diagram of a decoder device of background art.
Figures 11A, 11B, 11C, 11D, 11E, 11F:
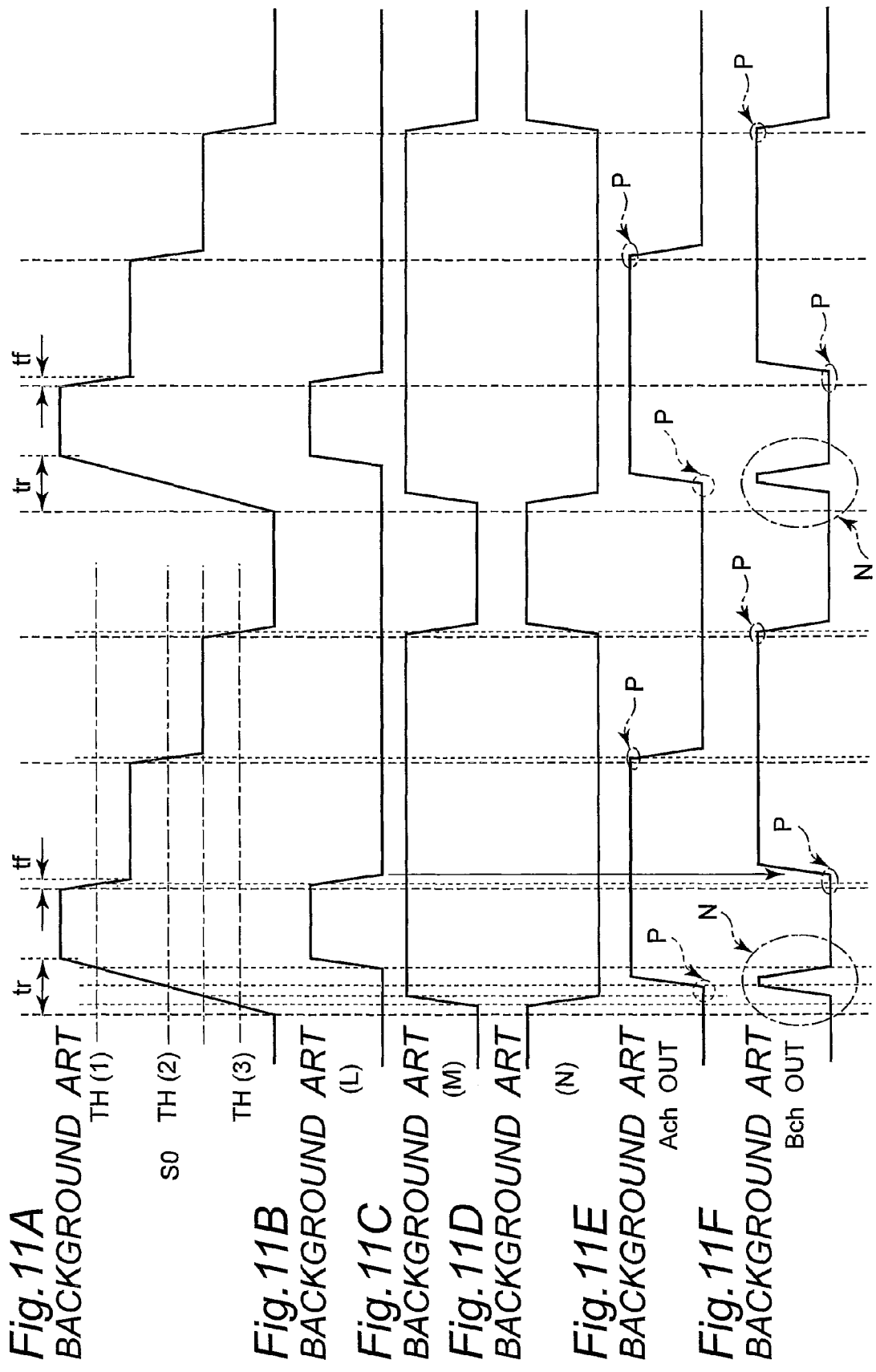
FIGS. 11A-11F are waveform charts showing an actual single output waveform with a finite slew rate and waveforms of output signals (L), (M) and (N) shown in FIG. 9 and A-phase and B-phase digital output waveforms, respectively.

Compared to the B-phase output signal shown in FIG. 9, the B-phase output signal Bch OUT derived from the digital signal (H) shown in FIG. 2I has a phase shift P suppressed and a noise pulse N decreased.

As described above, in the present embodiment, to obtain a B-phase output signal Bch OUT from an input signal S1, two threshold levels (2)-1 and (2)-2, which are above and below the threshold level (2) corresponding to the central voltage (reference voltage V3), are set with respect to the second stepped waveform S12 of the stair-stepped waveform input signal S1. Then, both the threshold level (2)-1 closer to the threshold level (1) than the threshold level (2) and the threshold level (1) are respectively compared with an input signal S1 to generate digital signals (A) and (B). Accordingly, it becomes possible to reduce the phase shift between the digital signal (A) as the first comparison output signal and the digital signal (B) as the second comparison output signal. Both the threshold level (2)-2 closer to the threshold level (3) than the threshold level (2) and the threshold level (3) are respectively compared with an input signal S1 to generate digital signals (C) and (D). Accordingly, it becomes possible to reduce the phase shift between the digital signal (C) as the first comparison output signal and the digital signal (D) as the second comparison output signal. Therefore, it follows that the B-phase output signal Bch OUT obtained by OR operation between the digital signal (E), which was obtained from the digital signals (A) and (B) with a decreased phase shift, and the digital signal (F), which was obtained from the digital signals (C) and (D) with a decreased phase shift, has the phase shift P and the noise pulse N suppressed.

It is advantageous to set each threshold level to have a potential as close to each other as possible in order to reduce a phase difference in the rising and falling edges in the same phase of each signal inputted into each of the logic operation circuits such as the NOR circuits 6, 7 and the OR circuit 8, which perform logical operation. Consequently, the maximum and minimum threshold levels (1) and (3) in FIG. 2A should preferably be set in positions as close to the central voltage (reference voltage V3) as possible so far as comparison is possible with those threshold levels, so that there are less potential difference between those threshold levels and other threshold levels (2)-1 and (2)-2. In the disclosed embodiment, the central voltage V3 corresponding to the threshold level (2) was set to ½ of the total amplitude of the stair-stepped waveform input signal S1 as an example, and the center between the threshold level (2)-1 and the threshold level (2)-2 was set as the threshold level (2). A potential difference between the threshold level (1) and the threshold level (2)-1, a potential difference between the threshold level (2)-1 and the threshold level (2)-2, and a potential difference between the threshold level (2)-2 and the threshold level (3) were made equal.

Although the embodiment is described in conjunction with an input signal which is of a stair-stepped waveform with three steps, the invention is applicable to input signals which are of stair-stepped waveforms with more than three steps.

For example, as shown in FIG. 5, when an input signal Sn has a stair-stepped waveform with n steps, where n is three or a larger natural number, with slew rate being constant and with the steps having an equal amplitude voltage, reference voltages corresponding to respective threshold levels are set at voltage intervals of Vint, which is expressed by the following formula (1):

$$V\text{int}=(V\text{smax}-V\text{smin})/(2n-3) \quad (1)$$

wherein Vsmax is a reference voltage corresponding to the maximum threshold level and Vsmin is a reference voltage corresponding to the minimum threshold level.

The formula (1) is derived in the following process. That is, while only one threshold level is present in each of the upper-end stepped waveform W(n) and the lower-end stepped waveform W(1) of the stair-stepped waveform input signal, two threshold levels are present in, each of the respective stepped waveforms W(2) to W(n-1) except the upper-end and lower-end stepped waveforms W(n) and W(1). Therefore, the total number of threshold levels SL(1) to SL(n) is 2+(n-2)×2=(2n-2). The number of threshold level intervals for the (2n-2) threshold levels is expressed as (2n-3). Therefore, a difference between the reference voltage Vsmax corresponding to the maximum threshold level and the reference voltage Vsmin corresponding to the minimum threshold level (Vsmax-Vsmin) is divided by the number of threshold level intervals (2n-3) so that the interval or pitch of (2n-2) threshold levels can be set as an uniform voltage difference. Accordingly, a phase shift attributed to the slew rate in each step of the input signal Sn having a stair-stepped waveform is equally distributed among the steps. It is to be noted that in FIG. 5, the central voltage VC is ½ of the total amplitude of the stair-stepped waveform input signal Sn having n steps.

A value of the threshold level SL(n) which intersects a riser section of the nth stepped waveform W(n) is closer to the central voltage VC than the central voltage of the riser section of the nth stepped waveform W(n), and a value of the threshold level SL(1) which intersects a riser section of the first stepped waveform W(1) is closer to the central voltage. VC than the central voltage of the riser section of the first stepped waveform W(1). The first threshold level represented by the first threshold level signal is set to intersect with a riser section of a stepped waveform W(k) out of adjacent two stepped waveforms W(k) and W(k-1), and the second threshold level represented by the second threshold level-signal is set to intersect with a riser section of the stepped waveform W(k-1). In this case, k is an arbitrary natural number from 2 to n, and the first and second threshold levels are two adjacent threshold levels between which interposed is a boundary level SS(k-1) which is a voltage defying the boundary of the adjacent two stepped waveforms W(k) and W(k-1). Then, the first threshold level signal and the input signal Sn are inputted into the first comparator, and the second threshold level-signal and the input signal Sn are inputted into the second comparator. A resulting first comparison output signal outputted from the first comparator and a second comparison output signal outputted from the second comparator are then inputted into the logical operation section composed of, for example, NOR circuits, OR circuits and the like as shown in FIG. 1 to decode the input signal Sn.

Accordingly, a phase shift attributed to the slew rate in each step of the stair-stepped waveform input signal Sn is equally distributed among the steps, so that the noise pulse and the phase shift can be suppressed to the minimum level.

Although the first and second threshold levels are made as the threshold levels corresponding to adjacent stepped waveforms in the above example, the first and second threshold levels may be threshold levels corresponding to two stepped waveforms with one or more stepped waveforms interposed therebetween.

Second Embodiment

FIG. 3 shows a decoder in a second embodiment of the invention. The second embodiment is different from the above-mentioned first embodiment only in the point that two NOT circuits 31, 32 are connected in series to the output side of the comparator 3 in the first embodiment, and therefore the component parts similar to those in the first embodiment are denoted by similar reference signs and only the difference from the first embodiment will be explained.

In the second embodiment, after a digital output signal (G) as a third comparison output signal is obtained by comparing, with use of the comparator 3 as a third comparator, an stair-stepped waveform input signal S1 inputted into the input terminal 11 from a single output signal line with a reference voltage V3 as a third threshold level signal corresponding to a threshold level (2), and the digital output signal (G) is then subjected to two NOT operations in two NOT circuits 31 and 32 which constitute a second logical operation section, the signal is outputted as an A-phase digital output signal Ach OUT that is a second decoded signal. In this way, the number of logical operations performed on an input signal S1 till an A-phase digital output signal Ach OUT is outputted can be made equal to the number of logical operations performed on the input signal S1 till a B-phase digital output signal Bch OUT is outputted, the B-phase digital output signal Bch OUT being a first decoded signal subjected to logical operation performed in the NOR circuits 6, 7 and the OR circuit 8 which constitute a first logical operation section. As a result, it becomes possible to reduce a relative phase difference between the A-phase digital output signal Ach OUT and the B-phase digital output signal Bch OUT.

Third Embodiment

Figure 4A:
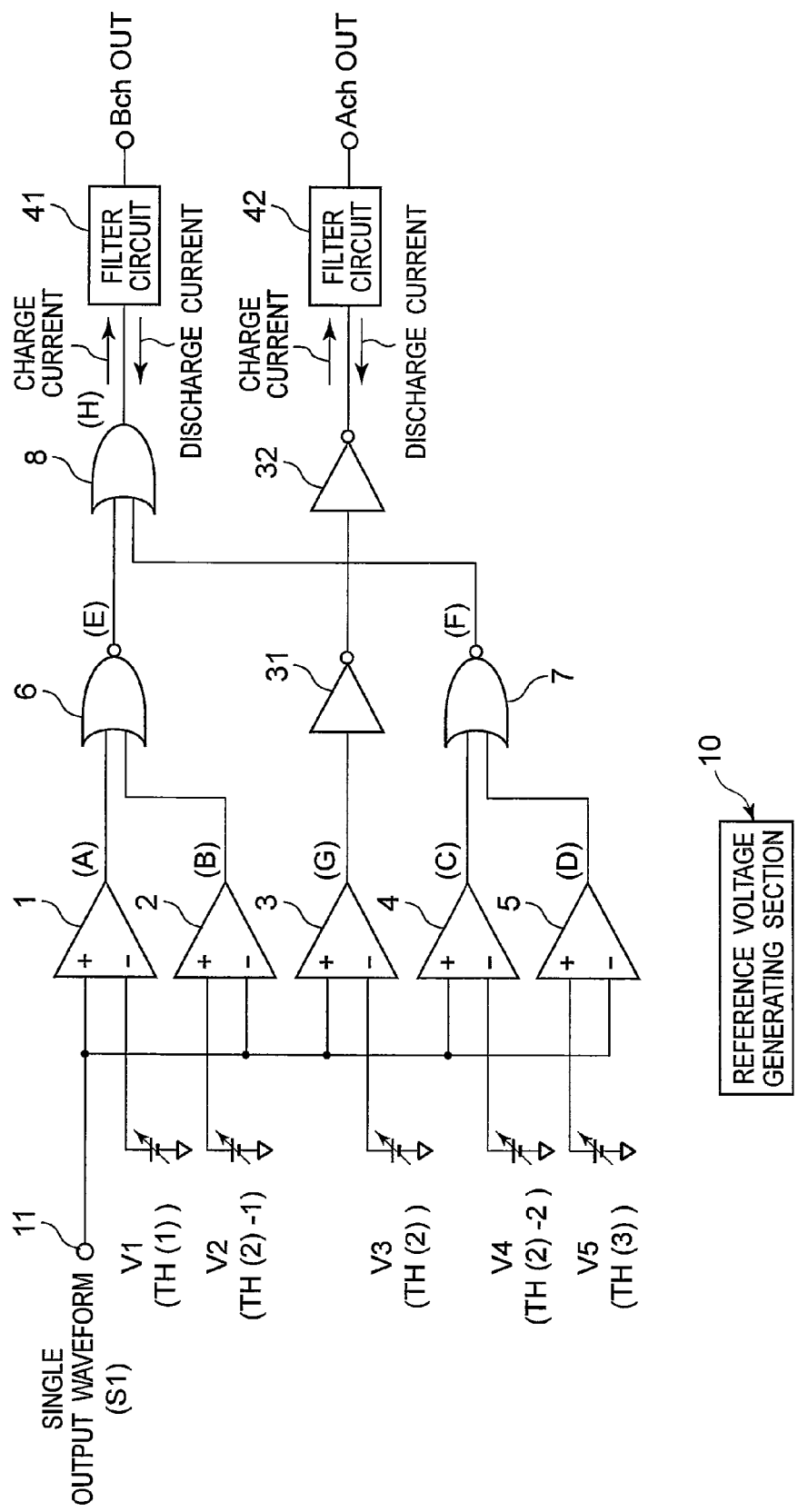
FIG. 4A is a block diagram showing a third embodiment of the decoder device of the invention.

FIG. 4A shows a decoder in a third embodiment of the invention. The third embodiment is different from the above-mentioned second embodiment only in the point that a lowpass filter circuit 41 is connected to the output side of the OR circuit 8 in the second embodiment and a lowpass filter circuit 42 is connected to the output side of a NOT circuit 32. Therefore, in the third embodiment, description is mainly given of the difference from the second embodiment.

In the third embodiment, in order to more thoroughly reduce the noise pulse of the A-phase output signal Ach OUT and the B-phase output signal Bch OUT, the lowpass filter circuits 41 and 42 are connected to between output terminals of the A-phase, B-phase output signals Ach OUT, Bch OUT and the OR circuit 8 and the NOT circuit 32. That is, according to the third embodiment, the A-phase and B-phase output signals from the OR circuit 8 and the NOT circuit 32 having a less relative phase difference are passed through the lowpass filter circuits 41 and 42, so that the noise pulse can more certainly be decreased. Further, a current for charge and discharge of the capacitances of each of the lowpass filter circuits 41 and 42 is set at a desired value, so that it becomes possible to control the slew rate of the rising edge and the falling edge of the A-phase and B-phase output signals independently. It is beneficial to provide the lowpass filter circuits 41 and 42 with, for example, cut-off frequency fc=1 MHz since a motor control system for general use is used at 100 kHz or lower.

Fourth Embodiment

FIG. 4B shows a decoder in a fourth embodiment of the invention. The fourth embodiment is different from the above-mentioned second embodiment only in the paint that there are provided a lowpass filter circuit 51 connected to between the comparator 1 and the NOR circuit 6 of the second embodiment, a lowpass filter circuit 52 connected to between the comparator 2 and the NOR circuit 6, a lowpass filter circuit 53 connected to between the comparator 3 and the NOT circuit 31, a lowpass filter circuit 54 connected to between the comparator 4 and the NOR circuit 7, and a lowpass filter circuit 55 connected to between the comparator 5 and the NOR circuit 7. Therefore, in the fourth embodiment, description is mainly given of the difference from the second embodiment.

In the fourth embodiment, digital output signals (A), (B), (G), (C) and (D) from the respective comparators 1, 2, 3, 4 and 5 are passed through the lowpass filter circuits 51, 52, 53, 54 and 55 so that the slew rate of the respective digital output signals (A), (B), (G), (C) and (D) can be controlled. Consequently, in the digital signal resulting from logical operation performed by the NOR circuits 6, 7, the NOT circuits 31, 32 and the OR circuit 8 in the subsequent stage of the lowpass filter circuits 51 to 55, generation of the noise pulse can be more suppressed and a relative phase shift between A-phase and B-phase digital signals can also be reduced. It is beneficial to provide the lowpass filter circuits 51 to 55 with, for example, cut-off frequency fc=1 MHz since a motor control system for general use is used at 100 kHz or lower.

Fifth Embodiment

Figure 6:
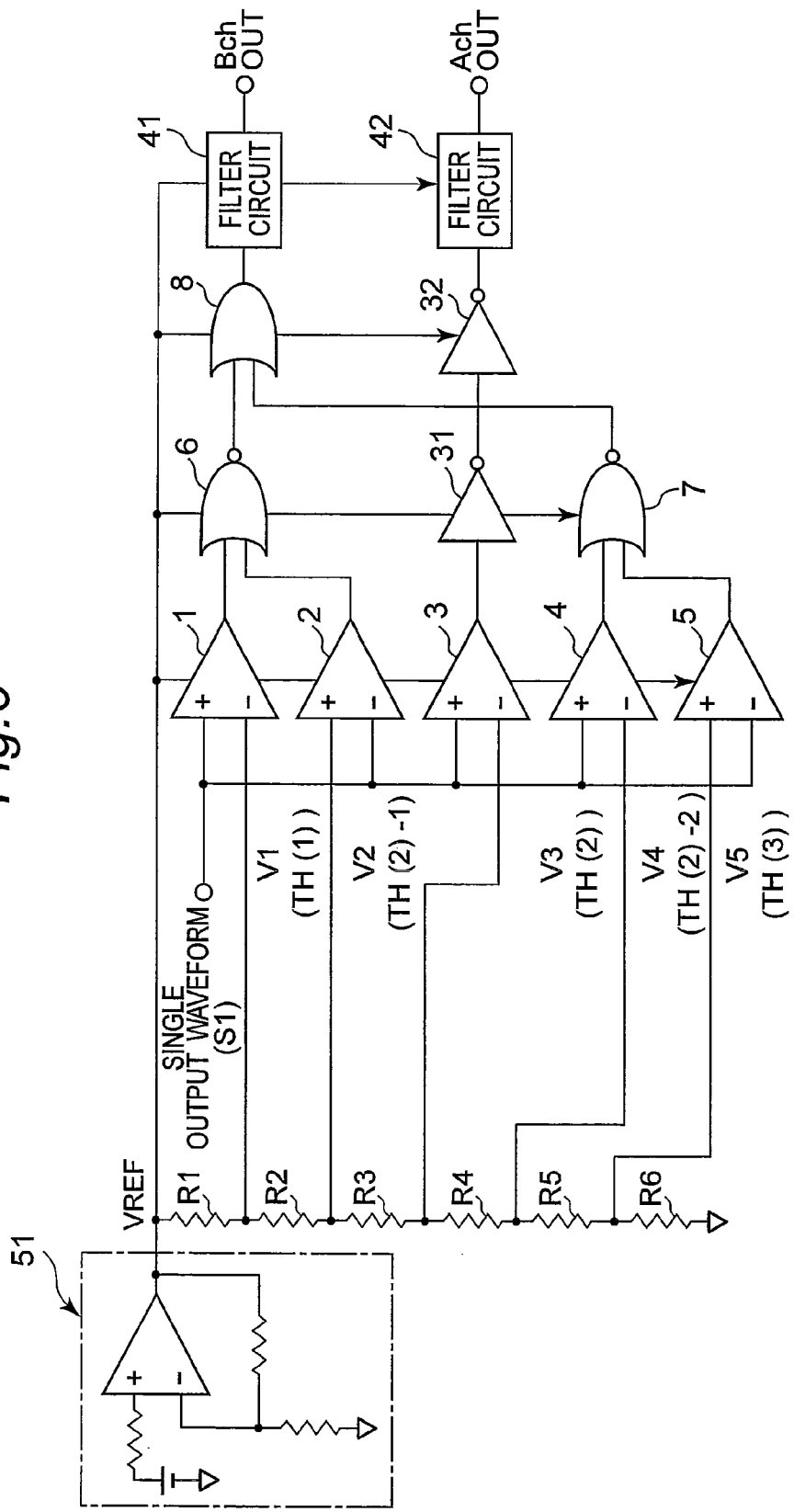
FIG. 6 is a block diagram showing a fifth embodiment of the decoder device of the invention.

FIG. 6 shows a decoder in a fifth embodiment of the invention. The fifth embodiment is different from the third embodiment shown in FIG. 4A in the point that the reference voltage generating section 10 is replaced with a reference voltage generating section 51 which outputs a reference voltage VREF, and voltages obtained by dividing the reference voltage VREF by series connected resistances are used as reference voltages V1 to V5. Therefore, in the fifth embodiment, description is mainly given of the difference from the third embodiment.

In the fifth embodiment, six resistors R1 to R6 are connected in series between an output side of the reference voltage generating section 51 and a GND (ground). In the present embodiment, the resistance values of the respective resistors R1 to R6 are set to be identical. A reference voltage V1 is inputted into an inverting input terminal of the comparator 1 from a junction point between the resistors R1 and R2, and a reference voltage V2 is inputted into a non-inverting input terminal of the comparator 2 from a junction point between the resistors R2 and R3. A reference voltage V3 is inputted into an inverting input terminal of the comparator 3 from a junction point between the resistors R3 and R4, a reference voltage V4 is inputted into an inverting input terminal of the comparator 4 from a junction point between the resistors R4 and R5, and a reference voltage V5 is inputted into a non-inverting input terminal of the comparator 5 from a junction point between the resistors R5 and R6.

In the present embodiment, since a reference voltage VREF generated by one reference voltage generating section 51 is divided into five reference voltages V1-V5, the circuit structure can be downsized compared to the case where a plurality of separate voltage generation circuits are provided for generating the respective reference voltages V1 to V5. Moreover, in addition to reduction in the circuit area, the respective reference voltages share the same conditions with respect to process variation, noise and the like, so that high consistency is ensured among the respective threshold levels by the respective reference voltages V1 to V5 and thereby the possibility of a phase shift, generation of a noise pulse and the like can be suppressed.

In this embodiment, the reference voltage VREF generated by the reference voltage generating section 51 is fed to the respective comparators 1 to 5, the NOR circuits 6, 7, the NOT circuits 31, 32, the OR circuit 8 and the filter circuits 41, 42 as a power supply. Accordingly, comparison operation of each signal can be executed with sufficient consistency in terms of temperature characteristics, process variation and the like, and thereby the noise pulse and the like can be reduced.

Figure 7:
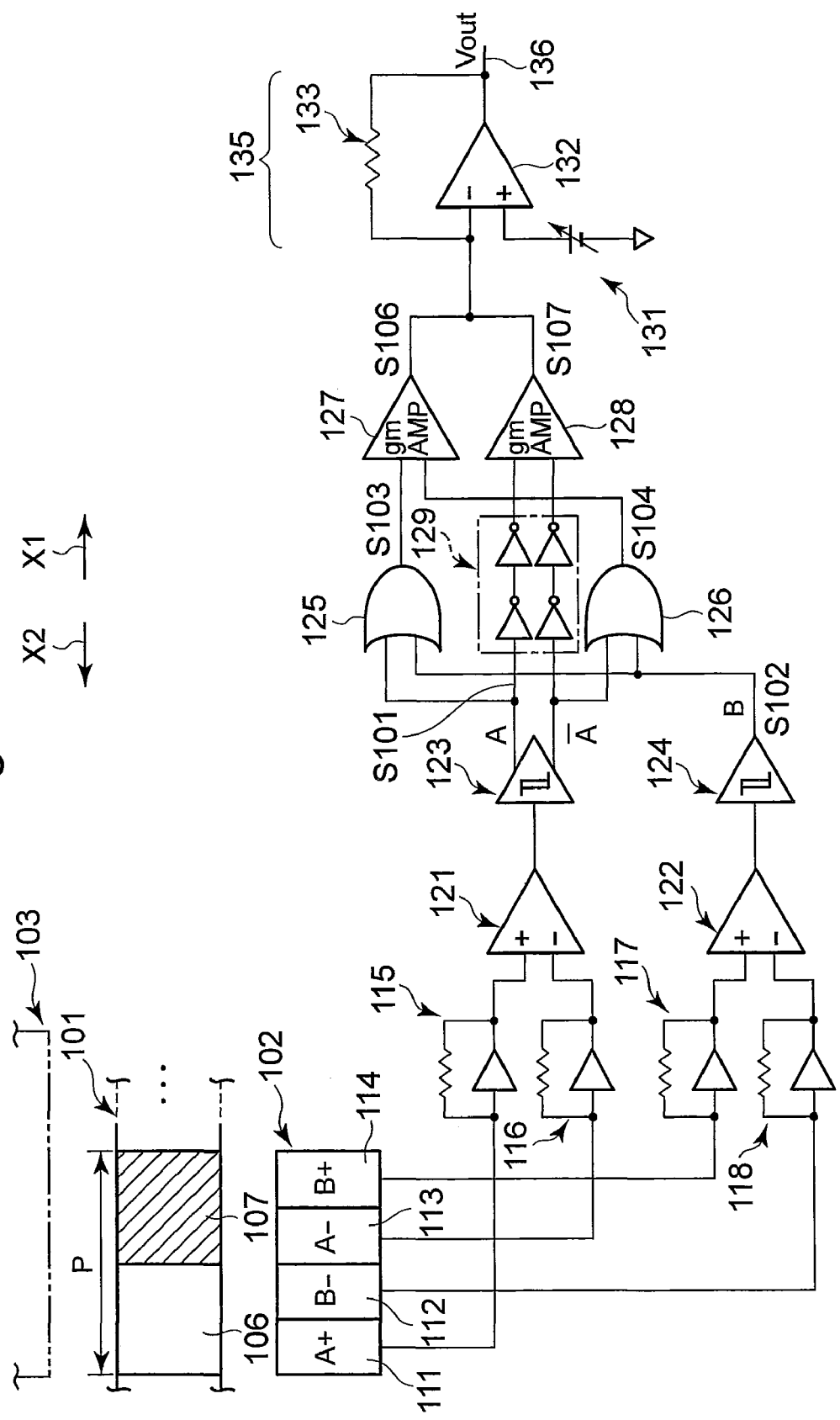
FIG. 7 is a block diagram of an optical encoder which outputs as a single output signal a stair-stepped waveform input signal S1, which is inputted into an input terminal of the decoder device of anyone of the first to fifth embodiments.

It is to be noted that as the stair-stepped waveform input signal S1 which is a single output signal inputted into the input terminal of the decoder of the first to fifth embodiments, a single output signal of an optical encoder is employed for example. An example of such an optical encoder is shown in FIG. 7. The optical encoder is composed of a movable object 101, a light receiving section 102, and a light emitting section 103. The light emitting section 103 is constituted of a light emitting element such as LEDs (Light Emitting Diodes). The light receiving section 102 has four light receiving elements 111 to 114. The movable object 101 is movable in the direction shown by arrow X1 or X2, with a light-ON section 106 and a light-OFF section 107 being alternately arranged in the moving direction. With the array pitch of the light-ON section 106 being P, the moving direction size (width size) of the light-ON section 106 and the light-OFF section 107 is (½)P. The light-ON section 106 passes a light beam from the light emitting section 103 to the light receiving section 102 side, while the light-OFF section 107 does not pass the light beam from the light emitting section 103 to the light receiving section 102 side. In this optical encoder, the width size of each light receiving element 111 to 114 is set to (¼)P. Each light receiving element 111 to 114 is adjacent to each other without intervals in the moving direction. Therefore, with 1 pitch P being set to 360 degrees, light receiving signals A+, B−, A−, B+ respectively outputted by the light receiving elements 111, 112, 113, 114 each have a phase shifted from each other by 90 degrees.

The optical encoder includes current voltage conversion sections 115 to 118, differential amplifiers 121, 122, and AD converters 123, 124, and further includes a light receiving signal processing section which is composed of OR circuits 125, 126, a delay circuit 129, gm amplifier 127, 128, and a negative feedback circuit 135.

A light receiving signal A+ outputted by the light receiving element 111 is inputted into a non-inverting input terminal of the differential amplifier 121 via the current voltage conversion section 115, while a light receiving signal A− outputted by the light receiving element 113 is inputted into an inverting input terminal of the differential amplifier 121 via the current voltage conversion section 116. A light receiving signal B− outputted by the light receiving element 112 is inputted into an inverting input terminal of the differential amplifier 122 via the current voltage conversion section 118, while a light receiving signal B+ outputted by the light receiving element 114 is inputted into a non-inverting input terminal of the differential amplifier 122 via the current voltage conversion section 117.

The differential amplifier 121 amplifies a difference between the light receiving signal A+ converted into a voltage and the light receiving signal A− converted into a voltage, and outputs this amplified signal to the AD converter 123. The differential amplifier 122 amplifies a difference between the light receiving signal B+ converted into a voltage and the light receiving signal B− converted into a voltage, and outputs this amplified signal to the AD converter 124. Then, the AD converter 123 converts the amplified signal inputted from the differential amplifier 121 into a digital signal A (signal S101) and an inverted digital signal /A, which are outputted into the delay circuit 129 constituted of an inverter and into the OR circuits 125, 126. The AD converter 124 converts the amplified signal inputted from the differential amplifier 122 into a digital signal B (signal S102), and outputs it to the OR circuits 125, 126. Consequently, as shown in the waveform charts of FIG. 8A-8G, the OR circuit 125 outputs an OR signal S103 of the digital signals A and B, i.e., the signals S101 and S102, to the gm (mutual conductance) amplifier 127, whereas the OR circuit 126 outputs an OR signal S104 of the inverted digital signal /A and the digital signal B to the gm amplifier 127. Meanwhile, the delay circuit 129 delays the digital signal A and the inverted digital signal /A, and outputs them to the gm amplifier 128. It is to be noted that the delay circuit 129 is to prevent the phase delay from being generated between the OR signals S103, S104 outputted by the OR circuit 125, 126 and the digital signal A and the inverted digital signal /A outputted to the gm amplifier 128. The waveform charts of FIG. 8A-8G are waveform charts when the movable object 101 moves in the direction of the arrow X2 in FIG. 7.

Figure 8:
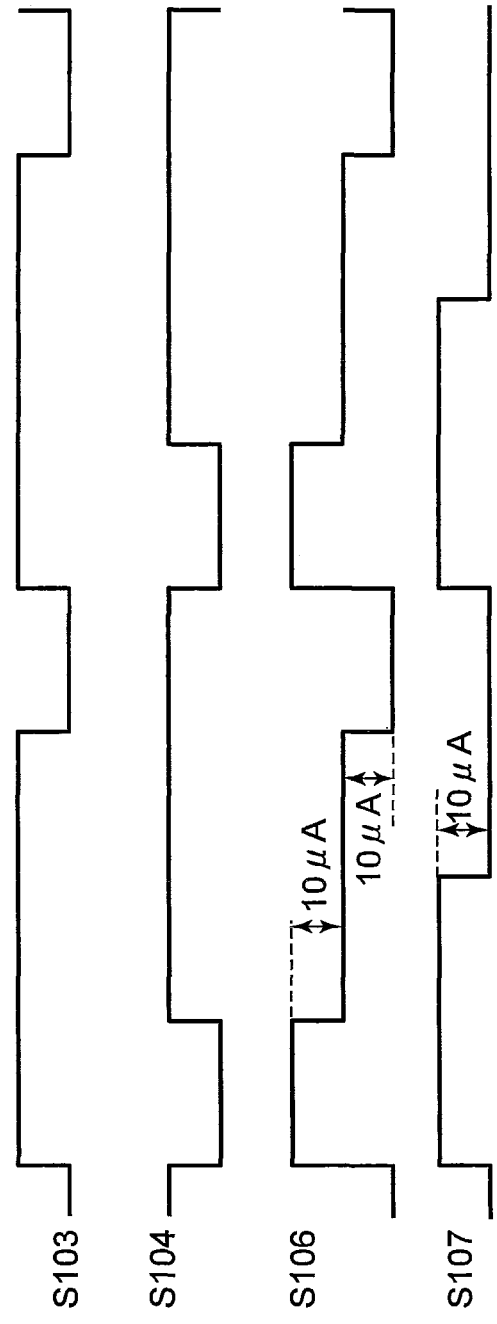
FIGS. 8A-8G are waveform charts respectively showing signal waveforms in the optical encoder.

The gm amplifier 127 outputs a current output signal S106 from the inputted OR signals S103 and S104. As shown in FIGS. 8C-8E, the current output signal S106 has a waveform formed by overlapping a current wave of the OR signal S103 with an amplitude of 10 μA in the period of H level and a current wave of the OR signal S104 with an amplitude of 10 μA in the period of H level. Meanwhile, the gm amplifier 128 outputs a current output signal S107 derived from the digital signal A and the inverted digital signal /A inputted from the delay circuit 129, the digital signal A having an amplitude of 10 μA in the period of H level. Although the amplitude of the current wave was 10 μA in each of the periods, it is not a restrictive but an illustrative value, and other values may be used instead. The current output signals S106 and S107 are added together and inputted into the resistor 133, where the signals are IV-converted to provide an output signal S108 with a stair-step waveform shown in FIG. 8G. When the digital signal A rises to the H level, the output signal S108 with a stair-step waveform rises to 3×V0, and when the digital signal B rises to the H level, the output signal S108 falls to 2×V0, whereas when the digital signal A falls to the L level, the output signal S108 falls to 1×V0, and when the digital signal B falls to the L level, the output signal S108 falls to 0×V0. It is to be noted that the voltage V0 is a value defined by a product of a current amplitude of 10 μA of the current output signal S107 and a resistance R of the resistor 133.

The output signal S108 with a stair-step waveform shown in FIG. 8G has the same waveform as the digital signal A that is an A-phase output in the voltage range (2) of V0 to 2 V0. The digital signal B that is a B-phase output can be generated by inverting a waveform component of the output signal S108 in the voltage range (1) of 2V0 to 3 V0 and performing logic synthesis of this waveform component with a waveform component in the voltage range (3) of 0-V0. More specifically, according to the optical encoder, the output signal S108 with a stair-step waveform which is a detection signal from the single output signal line 136 can provide phase information and movement information on an A-phase component of the original digital signal A and phase information and movement information of a B-phase component of the original digital signal B. The single output signal S108 with a stair-step waveform outputted by the optical encoder makes a stair-stepped waveform input signal S1 shown in FIG. 2A.

Therefore, connecting the input terminal 11 in any one of the first to fifth embodiments to the single output signal line 136 of such an optical encoder makes it possible to generate a desired digital signal with delay of the A-phase output signal Ach OUT and the B-phase output signal Bch OUT and generation of the noise component suppressed when the A-phase output signal Ach OUT and the B-phase output signal Bch OUT are generated as a plurality of digital signals carrying movement information from the single output signal S1. As a result, it becomes possible to control movement of the movable object based on the A-phase output signal Ach OUT and the B-phase output signal Bch OUT, so that a more high-precision movement controller can be implemented. Such a movement controller is particularly suitable as a movement controller mounted on printing equipment such as copying machines and printers and FA (factory automation) equipment.

Embodiments of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

REFERENCE SIGNS LIST 1-5: comparators
6, 7: NOR circuits
8: OR circuit
11: input terminal
31, 32: NOT circuits
41, 42, 51-55: lowpass filter circuits
(1), (2)-1, (2), (2)-2, (3): threshold levels
S11-S13: stepped waveforms
P11-P13: riser sections
F11-F13: flat sections
V1-V5: reference voltages
(A)-(E), (G), (H): digital signals
Ach OUT: A-phase digital output signal
Bch OUT: B-phase digital output signal

CITATION LIST

Patent Literature

PTL1: JP 60-88316 A
PTL2: JP H9-103086 A

The invention claimed is:

1. A decoder device, comprising:
a reference voltage generating section for outputting a first threshold level signal and a second threshold level signal;
a first comparator for receiving inputs of a stair-stepped waveform input signal and the first threshold level signal and comparing the input signal and the first threshold level signal to output a comparison result as a first comparison output signal;
a second comparator for receiving inputs of the stair-stepped waveform input signal and the second threshold level signal and comparing the input signal and the second threshold level signal to output a comparison result as a second comparison output signal; and
a logical operation section for receiving inputs of the first comparison output signal and the second comparison output signal and performing a logical operation between the first comparison output signal and the second comparison output signal to output a signal decoded from the stair-stepped waveform input signal, wherein
a threshold level represented by the first threshold level signal intersects a riser section of one stepped waveform out of two adjacent stepped waveforms in the stair-stepped waveform input signal, and a threshold level represented by the second threshold level signal intersects a riser section of the other stepped waveform out of the two adjacent stepped waveforms in the stair-stepped waveform input signal,
a level difference between the threshold level represented by the first threshold level signal and a boundary level which defines a boundary between the two adjacent stepped waveforms is smaller than a level difference between a center level of the riser section of the one stepped waveform and the boundary level, and
a level difference between the threshold level represented by the second threshold level signal and the boundary level is smaller than a level difference between a center level of the riser section of the other stepped waveform and the boundary level.

2. A movement controller, comprising:
the decoder device as claimed in claim 1,
wherein the stair-stepped waveform input signal is a signal obtained by coding a signal representing movement information of a movable object, and the logical operation section outputs a signal representing movement information decoded from the coded input signal, and
wherein movement of the movable object is controlled based on the signal representing the movement information.

3. The decoder device as claimed in claim 1, wherein
the logical operation section is set as a first logical operation section, and the decoded signal outputted from the first logical operation section is set as a first decoded signal, and
the reference voltage generating section outputs the first and second threshold level signals and a third threshold level signal,
the decoder device further comprising:
a third comparator for receiving inputs of the stair-stepped waveform input signal and the third threshold level signal and comparing the input signal and the third threshold level signal to output a comparison result as a third comparison output signal; and
a second logical operation section for receiving inputs of the third comparison output signal and performing logical operation on the third comparison output signal to output a second decoded signal decoded from the stair-stepped waveform input signal, the second decoded signal being different in phase from the first decoded signal, wherein
a number of logical operations performed on the third comparison output signal by the second logical operation section to output the second decoded signal is equal to a number of logical operations performed on the first and second comparison output signals by the first logical operation section to output the first decoded signal.

4. The decoder device as claimed in claim 1, wherein
the reference voltage generating section generates the threshold level signals by dividing a voltage by resistances connected in series between a reference voltage and a ground, and
the reference voltage is fed as supply voltage to each of the comparators.

5. The decoder device as claimed in claim 1, wherein
the stair-stepped waveform input signal has a stair-stepped waveform with n steps, n being three or a larger natural number;
the steps of the stair-stepped waveform have an equal amplitude voltage;
one threshold level intersects a riser section of an nth stepped waveform in the stair-stepped waveform, one threshold level intersects a riser section of a first stepped waveform in the stair-stepped waveform, two threshold levels intersect each of riser sections of a second to (n−1)th stepped waveforms in the stair-stepped waveform, and the two threshold levels intersecting the riser section of each of the second to (n−1)th stepped waveforms are symmetrically set relative to a central voltage of the respective stepped waveforms;

a voltage interval of Vint(V) between respective adjacent threshold levels of (2n−2) threshold levels for the stair-stepped waveform input signal is set at a value which is calculated with a following formula (1):

$$V\text{int}=(V\text{smax}-V\text{smin})/(2n-3) \quad (1)$$

where Vsmax (V) represents a voltage of the threshold level intersecting the riser section of the nth stepped waveform in the stair-stepped waveform, and Vsmin (V) represents a voltage of the threshold level intersecting the riser section of the first stepped waveform in the stair-stepped waveform; and of said threshold levels, one threshold level which intersects the riser section of a certain stepped waveform is set as the threshold level represented by the first threshold level signal, and another threshold level which intersects the riser section of another stepped waveform different from the certain stepped waveform is set as the threshold level represented by the second threshold level-signal.

* * * * *